US012757581B2

(12) United States Patent
Choe

(10) Patent No.: US 12,757,581 B2
(45) Date of Patent: Oct. 6, 2026

(54) LIGHT EMITTING DISPLAY DEVICE AND METHOD FOR MANUFACTURING THE SAME

(71) Applicant: LG Display Co., Ltd., Seoul (KR)

(72) Inventor: Dong Cheol Choe, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 422 days.

(21) Appl. No.: 18/485,146

(22) Filed: Oct. 11, 2023

(65) Prior Publication Data

US 2024/0260327 A1 Aug. 1, 2024

(30) Foreign Application Priority Data

Jan. 30, 2023 (KR) ........................ 10-2023-0012194

(51) Int. Cl.

| | |
|---|---|
| ***H10K 59/122*** | (2023.01) |
| ***H10K 59/12*** | (2023.01) |
| ***H10K 59/32*** | (2023.01) |
| ***H10K 59/80*** | (2023.01) |
| ***H10K 71/60*** | (2023.01) |

(52) U.S. Cl.

CPC ....... *H10K 59/122* (2023.02); *H10K 59/1201* (2023.02); *H10K 59/32* (2023.02); *H10K 59/80515* (2023.02); *H10K 59/80521* (2023.02); *H10K 71/60* (2023.02)

(58) Field of Classification Search

CPC ............. H10K 59/122; H10K 59/1201; H10K 59/80515; H10K 59/80521; H10K 59/32; H10K 71/60

See application file for complete search history.

(56) References Cited

U.S. PATENT DOCUMENTS

| | | | | |
|---|---|---|---|---|
| 10,636,995 B2 | 4/2020 | Lee et al. | | |
| 2007/0263164 A1* | 11/2007 | Kumagai | ............ | H10K 59/122 349/156 |
| 2009/0039773 A1 | 2/2009 | Jun et al. | | |
| 2014/0042400 A1 | 2/2014 | Kim et al. | | |
| 2014/0252321 A1 | 9/2014 | Pyon et al. | | |
| 2014/0361260 A1 | 12/2014 | Kim et al. | | |
| 2015/0060810 A1 | 3/2015 | Han et al. | | |

(Continued)

FOREIGN PATENT DOCUMENTS

| | | |
|---|---|---|
| KR | 10-2013-0028305 A | 3/2013 |
| KR | 10-1480973 B1 | 1/2015 |

(Continued)

OTHER PUBLICATIONS

Intellectual Property Office of the United Kingdom, Combined Search and Examination Report, United Kingdom Patent Application No. GB2317304.0, May 10, 2024, 10 pages.

*Primary Examiner* — Anne M Hines

(74) *Attorney, Agent, or Firm* — Fenwick & West LLP

(57) ABSTRACT

A light emitting display device includes a plurality of anodes provided on a substrate, a bank configured to expose light emitting parts of the plurality of anodes, an insulating pattern provided in a part of the bank, a first intermediate layer provided on another part of the bank different from the part where the insulating pattern is provided and the light emitting parts of the plurality of anodes, and a cathode configured to have a first area on the insulating pattern and a second area on the first intermediate layer.

17 Claims, 13 Drawing Sheets

(56) References Cited

U.S. PATENT DOCUMENTS

| | | | | |
|---|---|---|---|---|
| 2016/0035803 | A1* | 2/2016 | Kim | H10K 59/122 438/34 |
| 2016/0315135 | A1* | 10/2016 | Choi | H10K 59/124 |
| 2017/0125495 | A1* | 5/2017 | Lee | H10K 50/824 |
| 2019/0165298 | A1 | 5/2019 | Lee et al. | |
| 2021/0135149 | A1 | 5/2021 | Xin et al. | |
| 2022/0208867 | A1 | 6/2022 | Heo et al. | |

FOREIGN PATENT DOCUMENTS

| | | | |
|---|---|---|---|
| KR | 10-2019-0061739 | A | 6/2019 |
| KR | 10-2020-0029885 | A | 3/2020 |
| KR | 10-2020-0060861 | A | 6/2020 |

* cited by examiner

LIGHT EMITTING DISPLAY DEVICE AND METHOD FOR MANUFACTURING THE SAME

CROSS REFERENCE TO RELATED APPLICATIONS

This application claims the benefit of Republic of Korea Patent Application No. 10-2023-0012194, filed on Jan. 30, 2023, which is hereby incorporated by reference in its entirety.

BACKGROUND

Technical Field

The present disclosure relates to a display device, and more specifically to, a light emitting display device capable of preventing or at least reducing lateral leakage current by separating an intermediate layer between adjacent sub-pixels by changing a configuration above a bank, and a method for manufacturing the same.

Discussion of the Related Art

With the development of information technology, demand for image display devices in various forms is increasing.

A light emitting display device in which pixels are formed of light emitting devices does not require a separate light source unit, and is thus advantageous in slimness or flexibility, and has an advantage of good color purity.

For example, the light emitting device includes two different electrodes and a light emitting layer provided therebetween in which, when electrons generated from one electrode and holes generated from the other electrode are injected into the light emitting layer, the injected electrons and holes are combined to generate excitons, and when the generated excitons fall from an excited state to a ground state, light emission occurs.

In the light emitting display device in which the light emitting device is provided in each of the plurality of pixels, a common layer may be further provided between two electrodes that face each other in addition to the light emitting layer in order to improve light emission efficiency. The common layer may be common to the plurality of pixels, whereby, in a case where the mobility of the common layer is high, lateral leakage current in adjacent sub-pixels may occur.

SUMMARY

Accordingly, the present disclosure is directed to provide a light emitting display device and a method for manufacturing the same that substantially obviate one or more problems due to limitations and disadvantages of the related art.

An object of the present disclosure is to provide a light emitting display device in which an insulating layer is provided on a bank and an intermediate layer is separated between adjacent sub-pixels with the insulating layer interposed therebetween as a boundary to prevent or at least reduce lateral leakage current between adjacent sub-pixels.

Another object of the present disclosure is to provide a light emitting display device in which an electrode is connected to a cathode on an insulating layer and light emitting devices are separated by a structure on the cathode to prevent or at least reduce voltage drop of the cathode and secure uniformity in luminance for each area of a display area.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting display device includes a plurality of anodes provided on a substrate, a bank configured to expose light emitting parts of the plurality of anodes, an insulating pattern provided on a part of the bank, a first intermediate layer provided on another part of the bank different from the part where the insulating pattern is provided and the light emitting parts of the plurality of anodes, and a cathode configured to have a first area on the insulating pattern and a second area on the first intermediate layer.

Accordingly, the light emitting display device is capable of structurally preventing or at least reducing lateral leakage current and preventing or at least reducing voltage drop of the cathode.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
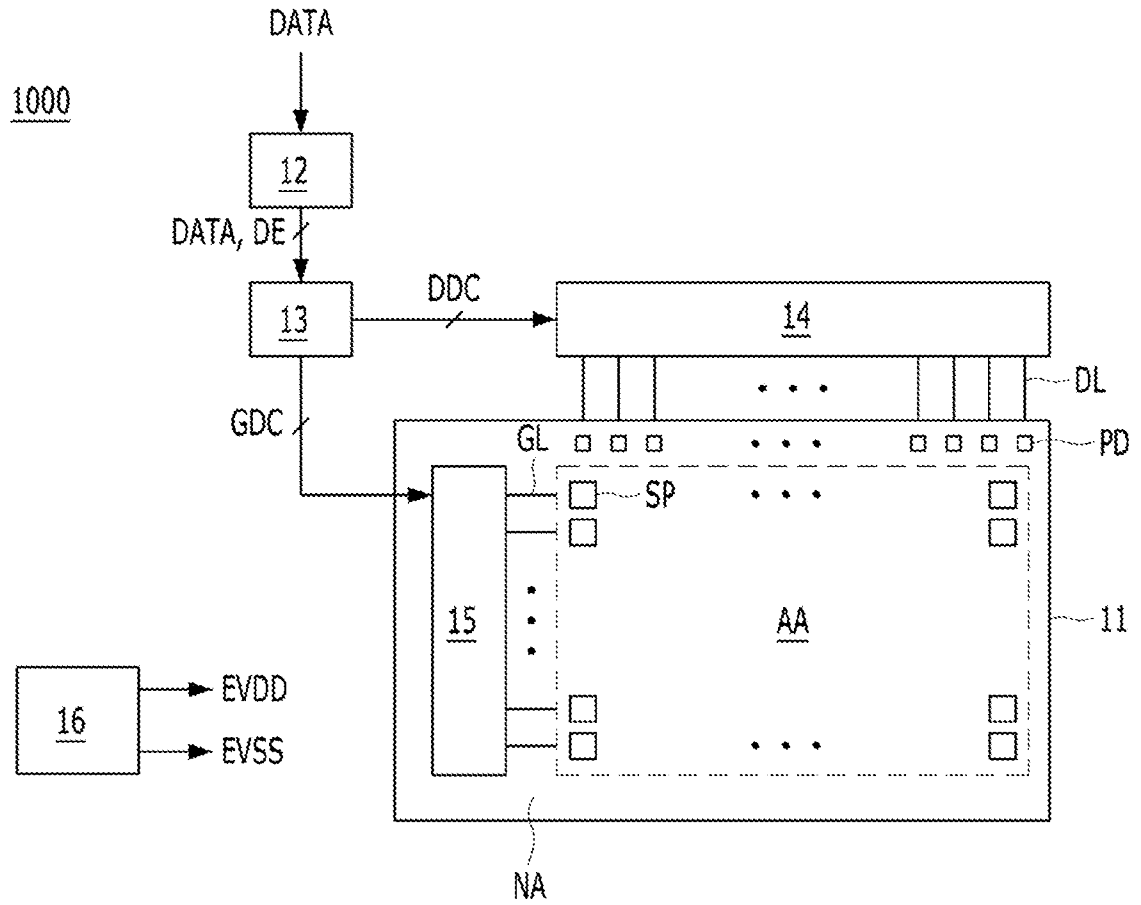
FIG. 1 is a block diagram schematically illustrating a light emitting display device according to an embodiment of the present disclosure.

Reference will now be made in detail to the preferred embodiments of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein will be omitted when the same may obscure the subject matter of the present disclosure. In addition, the names of elements used in the following description are selected in consideration of clear description of the specification, and may differ from the names of elements of actual products.

The shape, size, ratio, angle, number, and the like shown in the drawings to illustrate various embodiments of the present disclosure are merely provided for illustration, and are not limited to the content shown in the drawings. Wherever possible, the same reference numbers will be used throughout the drawings to refer to the same or like parts. In the following description, detailed descriptions of technologies or configurations related to the present disclosure may be omitted so as to avoid unnecessarily obscuring the subject matter of the present disclosure. When terms such as "including", "having", and "comprising" are used throughout the specification, an additional component may be present, unless "only" is used. A component described in a singular form encompasses a plurality thereof unless particularly stated otherwise.

The components included in the embodiments of the present disclosure should be interpreted to include an error range, even if there is no additional particular description thereof.

In describing a variety of embodiments of the present disclosure, when terms for positional relationships such as "on", "above", "under" and "next to" are used, at least one intervening element may be present between two elements, unless "immediately" or "directly" is used.

In describing a variety of embodiments of the present disclosure, when terms related to temporal relationships, such as "after", "subsequently", "next" and "before", are used, the non-continuous case may be included, unless "immediately" or "directly" is used.

In describing a variety of embodiments of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

Hereinafter, a light emitting display device and a method for manufacturing the same of the present specification will be described with reference to the drawings.

FIG. 1 is a block diagram schematically illustrating a light emitting display device according to an embodiment of the present disclosure.

As shown in FIG. 1, a light emitting display device 1000 according to an embodiment of the present disclosure may include a display panel 11, an image processor 12, a timing controller 13, a data driver 14, a scan driver 15, and a power supply 16.

The display panel 11 may display an image in response to a data signal DATA supplied from the data driver 14, a scan signal supplied from the scan driver 15, and power supplied from the power supply 16.

The display panel 11 may include a sub-pixel SP disposed in each intersection area of a plurality of gate lines GL and a plurality of data lines DL. The structure of the sub-pixel SP may be variously changed according to the type of the light emitting display device 1000.

For example, the sub-pixels SP may employ a top emission method, a bottom emission method, or a dual emission method, depending on the structure thereof. The sub-pixels SP refer to units capable of emitting light of their own color with or without a specific type of color filter. For example, the sub-pixels SP may include a red sub-pixel, a green sub-pixel, and a blue sub-pixel. Alternatively, the sub-pixels SP may include, for example, a red sub-pixel, a blue sub-pixel, a white sub-pixel, and a green sub-pixel. The sub-pixels SP may have one or more different light emitting areas according to light emitting characteristics. For example, a sub-pixel that emits light of a color different from that of a blue sub-pixel may have a different light emitting area.

One or more sub-pixels SP may form one unit-pixel. For example, one unit-pixel may include red, green, and blue sub-pixels, in which the red, green, and blue sub-pixels may be disposed in a repeated manner. Alternatively, one unit-pixel may include red, green, blue, and white sub-pixels, in which the red, green, blue, and white sub-pixels may be disposed in a repeated manner, or may be disposed in a quad type. In an exemplary embodiment of the present disclosure, the color type, disposition type, and disposition order of the sub-pixels are not limiting, and may be configured in various forms according to light emitting characteristics, device lifespans, and device specifications.

The display panel 11 may be divided into a display area AA (inside a dashed line) in which the sub-pixels SP are disposed to display an image and a non-display area NA outside the display area AA. The scan driver 15 may be mounted in the non-display area NA of the display panel 11. In addition, the non-display area NA may include a pad PAD including a pad electrode PD.

Here, the display area AA is also referred to as an active area, and the non-display area NA is also referred to as a non-active area.

The image processor 12 may output a data signal DATA supplied from the outside, a data enable signal DE, and the like. The image processor 12 may output one or more of a vertical sync signal, a horizontal sync signal, and a clock signal in addition to the data enable signal DE, but these signals are not shown for convenience of description.

The timing controller 13 may receive a driving signal and the data signal DATA from the image processor 12. The driving signal may include the data enable signal DE. Alternatively, the driving signal may include the vertical sync signal, the horizontal sync signal, and the clock signal. The timing controller 13 may output a data timing control signal DDC for controlling an operation timing of the data driver 14 and a gate timing control signal GDC for controlling an operation timing of the scan driver 15 on the basis of the driving signal.

The data driver 14 may sample and latch the data signal DATA supplied from the timing controller 13 in response to the data timing control signal DDC supplied from the timing controller 13, convert the result into a gamma reference voltage, and output the gamma reference voltage.

The data driver 14 may output the data signal DATA through the data lines DL. The data driver 14 may be implemented in the form of an integrated circuit (IC). For example, the data driver 14 may be electrically connected to the pad electrode PD disposed in the non-display area NA of the display panel 11 through a flexible circuit film (not shown).

The scan driver 15 may output a scan signal in response to the gate timing control signal GDC supplied from the timing controller 13. The scan driver 15 may output the scan signal through the gate lines GL. The scan driver 15 may be implemented in the form of an integrated circuit (IC), or may be implemented in a gate-in-panel (GIP) method in the display panel 11.

The power supply 16 may output a high-level power voltage and a low-level power voltage for driving the display panel 11. The power supply unit 16 may supply the high-level power voltage to the display panel 11 through a first power line EVDD (a driving power line or a pixel power line), and may supply the low-level power voltage to the display panel 11 through a second power line EVSS (an auxiliary power line or a common power line).

The display panel 11 is divided into the display area AA and the non-display area NA, and may include the plurality of sub-pixels SP defined by the gate lines GL and the data lines DL that cross each other in a matrix form in the display area AA.

The sub-pixels SP may include sub-pixels that emit at least two of red light, green light, blue light, yellow light, magenta light, or cyan light. Further, the plurality of sub-pixels SP may emit their own colors with or without a specific type of color filter. However, the present disclosure is not limited thereto, and the sub-pixels SP may be configured in various forms depending on the color type, disposition type, disposition order, and the like.

Each sub-pixel SP may include a light emitting part through which light is emitted and a non-light emitting part around the light emitting part.

Hereinafter, various embodiments of a light emitting display device and a method for manufacturing the same according to the present disclosure will be described.

A light emitting display device according to embodiments of the present disclosure is configured so that a display panel includes a substrate and an array provided on the substrate. Hereinafter, a configuration of a display area in the substrate will be mainly described.

Figure 2:
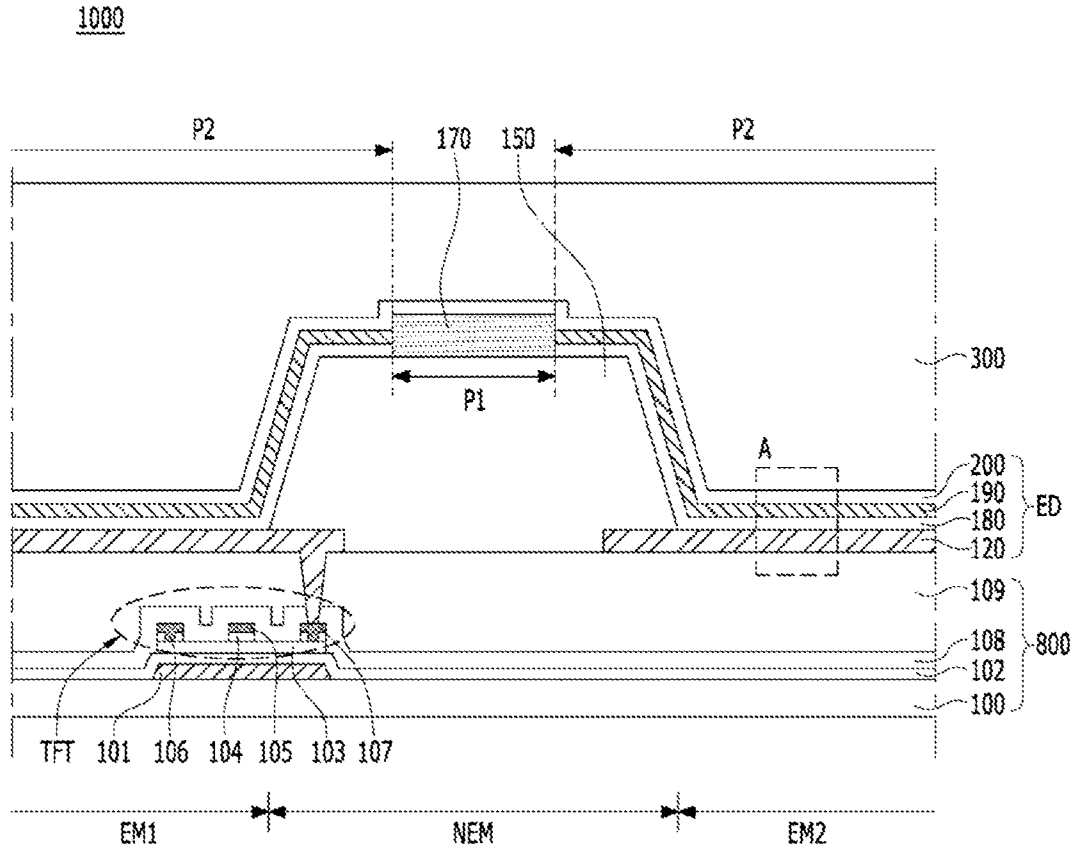
FIG. 2 is a cross-sectional view of a light emitting display device according to a first embodiment of the present disclosure.
Figure 3A:
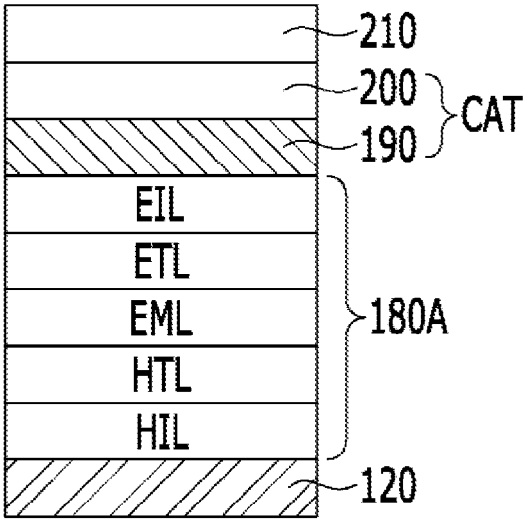
FIGS. 3A and 3B are enlarged cross-sectional views of area A in FIG. 2 according to an embodiment of the present disclosure.
Figure 3B:
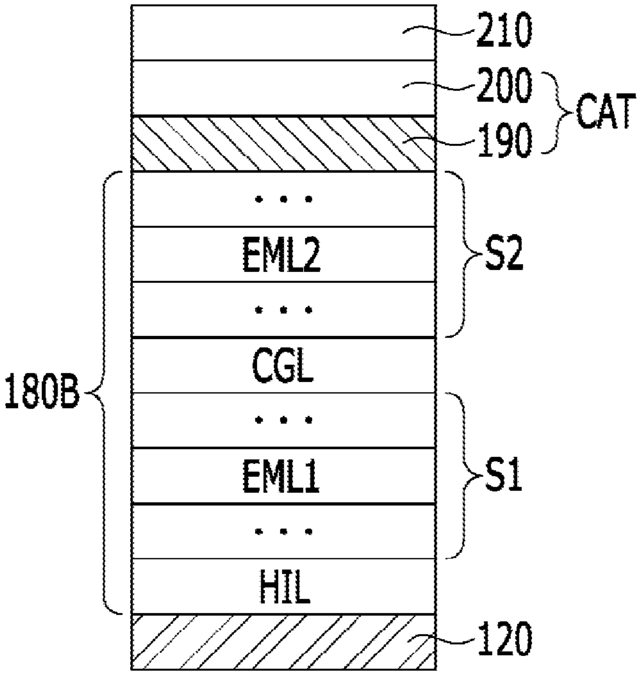

FIG. 2 is a cross-sectional view of a light emitting display device according to a first embodiment of the present disclosure, and FIGS. 3A and 3B are enlarged cross-sectional views of area A in FIG. 2.

As shown in FIG. 2, a light emitting display device 1000 according to the first embodiment of the present disclosure may include a plurality of anodes 120 provided on a substrate 100, a bank 150 that is formed to expose light emitting parts (EM1, EM2, . . . ) of the plurality of anodes 120, an insulating pattern 170 provided on a part of the bank 150, an intermediate layer 180 that is provided on a remaining part of the bank 150 excluding the part where the insulating pattern 170 is provided and the light emitting parts (EM1, EM2, . . . ) of the plurality of anodes 120 excluding the insulating pattern 170, and a cathode CAT including a first area P1 on the insulating pattern and a second area P2 on the intermediate layer.

Here, the first area P1 of the cathode CAT may be formed of a single first electrode 200, and the second area P2 of the cathode CAT may be formed by stacking the first electrode 200 and a second electrode 190 that is provided between the first electrode 200 and the intermediate layer 180. The second electrode 190 is continuous over the first area P1 and the second area P2.

In the light emitting display device 1000 according to the first embodiment of the present disclosure, the intermediate layer 180 and the second electrode 190 of the cathode are sequentially formed, and then, materials of the intermediate layer 180 and the second electrode 190 are removed from above the insulating pattern 170. Since the intermediate layer 180 on the insulating pattern 170 is removed to be separated between the adjacent first and second light emitting parts EM1 and EM2, it is possible to prevent or at least reduce lateral leakage current flowing between the first and second light emitting parts EM1 and EM2 in a case where the intermediate layer 180 is interposed therebetween. Here, a side surface of the intermediate layer 180 and a side surface of the second electrode 190 of the cathode are in contact with a side surface of the insulating pattern 170.

In the light emitting display device 1000 according to the first embodiment of the present disclosure, the intermediate layer 180 and the second electrode 190 are continuously formed through a deposition process, and then, the components on the insulating pattern 170 are removed. Thus, the intermediate layer 180 and the second electrode 190 are removed together from above the insulating pattern 170, and the second electrode 190 is also separated between the adjacent light emitting parts EM1 and EM2 at the same boundary as in the intermediate layer 180.

In the light emitting display device, in a case where the second electrode 190 that functions as a common electrode has an area that is partially removed from the display area, resistance of the second electrode 190 may increase due to the removed area. In the light emitting display device according to the first embodiment of the present disclosure, the first electrode 200 is formed evenly in an area where the insulating pattern 170 is positioned and an area where the insulating pattern 170 is not positioned on the second electrode 190, thereby making it possible to prevent or at least reduce an increase in resistance due to removal of a partial area of the cathode to prevent or at least reduce non-uniformity in luminance. As shown in FIG. 2, the first electrode 200 may contact an upper surface of the insulating pattern 170 on a lower surface thereof in the area where the insulating pattern 170 is positioned, and may contact an upper surface of the second electrode 190 on the lower surface thereof in the area where the insulating pattern 170 is not positioned.

Accordingly, in the light emitting display device 1000 according to the first embodiment of the present disclosure, in comparing the thickness of the cathode CAT in the first area P1 with the thickness of the cathode CAT in the second area P2, since the first area P1 includes the single first electrode 200 and the second area P2 includes the second electrode 190 and the first electrode 200, the second area P2 may be thicker. Since the second area P2 of the cathode CAT is provided on the light emitting parts (EM1, EM2, . . . ), components and a total thickness of the cathode CAT, which is defined as the stack of the second electrode 190 and the first electrode 200, may vary depending on light emitting methods in the light emitting parts (EM1, EM2, . . . ) that emit light to form a light emitting device ED.

In a case where the light emitting device ED employs a top emission type, the second electrode 190 and the first electrode 200 of the cathode CAT may be formed of the same or different transflective electrodes or transparent electrodes. Further, the anode 120 is formed to include a reflective electrode. For example, the reflective electrode included in the anode 120 may be formed of a material selected from a group comprising silver (Ag), aluminum (Al), copper (Cu), molybdenum (Mo), titanium (Ti), nickel (Ni), chromium (Cr), or tungsten (W), or an alloy thereof, as a single layer or multiple layers.

In some cases, in a case where the anode 120 includes a plurality of layers, the anode 120 may be formed in the order of a reflective electrode and a transparent conductive film, or in the order of a transparent conductive film, a reflective electrode, and a transparent conductive film. In this case, the transparent electrode of the anode 120 in contact with the intermediate layer 180 may be made of a transparent conductive material such as indium tin oxide (ITO) or indium zinc oxide (IZO) having a work function of a certain level or higher to reduce interfacial resistance of a barrier when holes are injected into the intermediate layer 180.

The second electrode 190 and the first electrode 200 of the cathode CAT may each be made of a transparent conductive material such as indium tin oxide (ITO) or indium zinc oxide (IZO), or may be made of a transflective electrode of any one of silver (Ag), aluminum (Al), magnesium (Mg), and calcium (Ca), or an alloy including at least one thereof, having a thickness thin enough to transmit light.

For example, in the light emitting device of the top emission method, in a case where the second electrode 190 and the first electrode 200 are transflective electrodes such as AgMg, respectively, the total thickness of the first and second electrodes 200 and 190 of the cathode (CAT) having the stacking structure in the light emitting parts EM1 and EM2 may be 50 Å to 200 Å. In a case where the second electrode 190 and the first electrode 200 are transparent electrodes such as IZO or ITO, respectively, the total thickness of the first and second electrodes 200 and 190 in the second area P2 may be 300 Å to 2000 Å.

For example, in a case where the first and second electrodes 200 and 190 are transflective electrodes in the second area P2 of the cathode CAT and the total thicknesses thereof is 12 nm (120 Å), the transmittance in the cathode CAT having the stacking structure of the first and second electrodes 200 and 190 has a value of 30% or higher at a wavelength of 550 nm. In this case, in the light emitting device ED, the thickness and physical properties of the intermediate layer 180 are adjusted to have micro-cavity characteristics with respect to a wavelength of a light emitting part corresponding thereto between the anode 120 and the cathode CAT, to thereby maximize light emission characteristics through the first and second electrodes 200 and 190.

Further, in a case where the light emitting device employs the bottom emission method, at least one of the second electrode 190 or the first electrode 200 included in the cathode CAT may include a reflective electrode. In a case where both the second electrode 190 and the first electrode 200 include the reflective electrode, the total thickness of the second electrode 190 and the first electrode 200 may be 500 Å (50 nm) to 2000 Å (200 nm).

For example, in a case where the total thicknesses of the first and second electrodes 200 and 190 that are made of reflective electrodes in the bottom emission method is 100 nm, the transmittance in the cathode CAT having the stacking structure of the first and second electrodes 200 and 190 is 5% or lower at the wavelength of 550 nm, in which the light generated in the intermediate layer 180 is mostly reflected downward from the cathode CAT and can be used for light emission through the anode 120.

As described above, the light emitting display device 1000 according to the first embodiment of the present disclosure may be applied by setting different components and thicknesses of the first and second electrodes 200 and 190 regardless of the light emitting methods of the light emitting device. That is, it is possible to achieve the effect of preventing or at least reducing lateral leakage current by removal of the intermediate layer 180 on the insulating pattern 170 regardless of the light emitting methods.

In the light emitting display device 1000 according to the first embodiment of the present disclosure, as shown in FIG. 2, each light emitting part (EM1, EM2, . . . ) is provided with the light emitting device ED formed by stacking the anode 120, the intermediate layer 180, the second electrode 190, and the first electrode 200.

In the light emitting device ED, the stacked second electrode 190 and first electrode 200 function as the cathode CAT.

As shown in FIG. 3A, an intermediate layer 180A may include a hole injection layer (HIL), a hole transport layer (HTL), a light emitting layer (EML), an electron transport layer (ETL), and an electron injection layer (ETL) that are sequentially formed on the anode 120. The intermediate layer 180A may be formed of, for example, a low molecular weight organic material or a high molecular weight organic material, or may be formed of a hybrid material in which an inorganic material and an organic material are mixed. In some cases, a part of the layers provided in the intermediate layer 180A may be formed of an organic material and the remaining part may be formed of an inorganic material.

Further, a capping layer 210 is provided above the cathode CAT to protect the light emitting device and increase the emission efficiency of light emitted from the light emitting device.

As shown in FIG. 3B, an intermediate layer 180B may include a hole injection layer (HIL), a plurality of stacks S1 and S2, and a charge generating layer (CGL) between the plurality of stacks S1 and S2, on the anode 120. The stacks S1 and S2 may respectively include a light emitting layer EML1 and a light emitting layer EML2 therein, and may include at least one common layer in addition to the light emitting layers. For example, the common layer may include a hole transport layer positioned below the light emitting layer and an electron transport layer positioned above the light emitting layer. In this way, since the capping layer 210 is also provided on the cathode CAT of the light emitting device having the plurality of stacked layers, it is possible to protect the light emitting device ED and improve the light emission efficiency of the light emitting device ED.

Further, the light emitting device may include a light emitting layer EML having a different color, corresponding to each of the light emitting parts (EM1, EM2, . . . ). For example, a red light emitting layer, a green light emitting layer, and a blue light emitting layer may be provided in different light emitting parts (EM1, EM2, . . . ), respectively. In this case, the red light emitting layer, the green light emitting layer, and the blue light emitting layer may be each formed using a fine metal mask (FMM) having an opening with respect to the light emitting part corresponding thereto.

However, the light emitting device of the present disclosure is not limited to a structure in which a light emitting layer of a different color is provided in each light emitting part. For example, a white light emitting layer may be commonly provided in the light emitting parts. Alternatively, colors of the light emitting layers provided in the plurality of stacks may be combined to finally emit white light. In this case, in determining the color of the light emitting part, a color filter may be further provided on the emission side for selective wavelength emission.

Even in a case where light emitting layers having different colors are provided in different light emitting parts (EM1, EM2, . . . ), the hole injection layer (HIL), the hole transport layer (HTL), the electron transport layer (ETL), and the electron injection layer (EIL) may be commonly provided. In this case, since the common layers (HIL, HTL, ETL, and EIL) are formed as an open mask having an opening at least in the display area including sub-pixels, it is possible to reduce the use of the FMM mask, and to secure a relatively free deposition process without being affected by an alignment margin.

However, a layer with high mobility among the common layers generates not only a vertical current but also a horizontal current, which may cause leakage current between adjacent sub-pixels through the common layers.

In the light emitting display device 1000 of the present embodiment, since the insulating pattern 170 is formed on the bank 150 and the intermediate layers (180, 180A, and 180B) deposited on the insulating pattern 170 are then removed, it is possible to prevent or at least reducing lateral leakage current flowing between the adjacent sub-pixels in a case where the intermediate layers (180, 180A, and 180B) are interposed therebetween.

In the light emitting display device 1000 of the present embodiment, since the entire intermediate layer 180 between the adjacent sub-pixels is removed from above the insulating pattern 170 to prevent or at least reduce lateral leakage current, it is possible to prevent or at least reduce any common layer from causing lateral leakage current.

On the other hand, in the second area P2 of the cathode CAT, the lower second electrode 190 may contact the electron injection layer (EIL) positioned on top of the intermediate layers (180, 180A, and 180B). The lower surface of the first area P1 of the cathode CAT directly contacts the insulating pattern 170, which is different from the second area P2.

Further, as shown in FIG. 2, an encapsulation layer 300 is provided on the light emitting device ED to protect components such as the thin film transistor TFT and the light emitting device ED that are formed on the substrate 100.

Here, the encapsulation layer 300 may include the capping layer 210 shown in FIGS. 3A and 3B at the lowermost side. In addition, the encapsulation layer 300 may have a thin film encapsulation stacking structure obtained by alternately stacking an inorganic encapsulation film and an organic encapsulation film on the capping layer 210.

In the light emitting display device of the present embodiment, the insulating pattern 170 protrudes vertically from the upper surface of the bank 150. Here, preferably, the thickness of the insulating pattern 170 is greater than the sum of the thickness of the intermediate layer 180 and the thickness of the second electrode 190 in order to distinguish the insulating pattern 170 from the surroundings of the insulating pattern 170 to easily remove the components on the insulating pattern 170. That is, as shown in FIG. 2, the insulating pattern 170 protrudes above the upper surface of the surrounding second electrode 190. In addition, the thickness of the insulating pattern 170 is equal to or less than the thickness of the encapsulation layer 300, and more preferably, is equal to or less than the thickness of the organic encapsulation film included in the encapsulation layer 300. For example, the thickness of the insulating pattern 170 is 8 μm or less. Thus, it is possible to prevent or at least reduce the insulating pattern 170 from protruding from the encapsulation layer 300 so as not to hinder the encapsulation function of the encapsulation layer 300.

The insulating pattern 170 has physical properties different from those of a sacrificial layer and a photosensitive film used as upper structures during the process. In particular, since the sacrificial layer and the photosensitive film are removed together with the material of the intermediate layer (and the second electrode) formed thereon by a removal process such as a lift-off process, the insulating pattern 170 is preferably made of a material that is easily separated from the sacrificial layer. For example, the insulating pattern 170 may be formed of a material insoluble in a fluorine solvent.

The insulating pattern 170 may be any one of an oxide film, a nitride film, and an organic material film having a fluorine content of 20% or less.

In a case where the insulating pattern 170 is made of an inorganic material, the inorganic material may be silicon nitride, aluminum nitride, zirconium nitride, titanium nitride, hafnium nitride, tantalum nitride, chromium nitride, silicon oxide, aluminum oxide, titanium oxide, tin oxide, cerium oxide, chromium oxide, or silicon oxynitride (SiON).

In a case where the insulating pattern 170 is made of an organic material, the organic material has a fluorine content of 20% or less to maintain the pattern in etching the sacrificial layer through the photosensitive film. That is, the insulating pattern 170 has physical properties different from those of the sacrificial layer having an excessive fluorine content.

Hereinafter, the remaining components among the configurations of FIG. 2 will be described.

In each of the light emitting parts EM1, EM2, . . . , the anode 120 of the light emitting device ED is connected to the thin film transistor TFT. For example, as shown in FIG. 2, the thin film transistor TFT includes a semiconductor layer 103, a gate electrode 105 that overlaps with a channel of the semiconductor layer 103 with a gate insulating film 104 being interposed therebetween, and a source electrode 106 and a drain electrode 107 connected to the semiconductor layer 103.

The source electrode 106 or the drain electrode 107 on the semiconductor layer 103 may be connected to the anode 120 of the light emitting device.

The semiconductor layer 103 may be made of at least one of an oxide semiconductor, amorphous silicon, or crystalline silicon.

A light blocking layer 101 may be further provided below the semiconductor layer 103 to prevent or at least reduce light coming from the lower side of the substrate 100 from affecting the semiconductor layer 103.

A buffer layer 102 may be further provided between the light blocking layer 101 and the semiconductor layer 103. The buffer layer 102 may be formed on the entire surface of the substrate 100 to prevent or at least reduce impurities of the substrate 100 from penetrating into the upper components.

An inorganic protective layer 108 and a planarization layer 109 may be sequentially formed to protect the thin film transistor TFT.

The buffer layer 102 and the inorganic protective layer 108 may be, for example, any one of a silicon oxide layer, a silicon nitride layer, a silicon oxynitride layer, a metal oxide layer, and a metal nitride layer.

Further, the planarization layer 109 may be formed of at least one of organic materials such as photo acryl, polyimide, benzocyclobutene resin, or acrylate.

The configuration from the substrate 100 to the planarization layer 109 including the thin film transistor TFT is referred to as a thin film transistor array substrate 800.

The anode 120 may be connected to the drain electrode 107 through a contact hole provided in the planarization layer 109 and the inorganic protective layer 108, and may be positioned on the planarization layer 109. The anodes 120 that are positioned on the planarization layer 109 and exposed by the bank 150 may be defined as the light emitting parts (EM1, EM2, . . . ).

The bank 150 is provided to overlap with an edge of the anode 120. The bank 150 may be made of organic materials such as polyamide, polyimide, acrylate, or benzocyclobutene series resin.

Hereinafter, a planar structure applicable to the light emitting display device of the present disclosure will be described.

Figure 4:
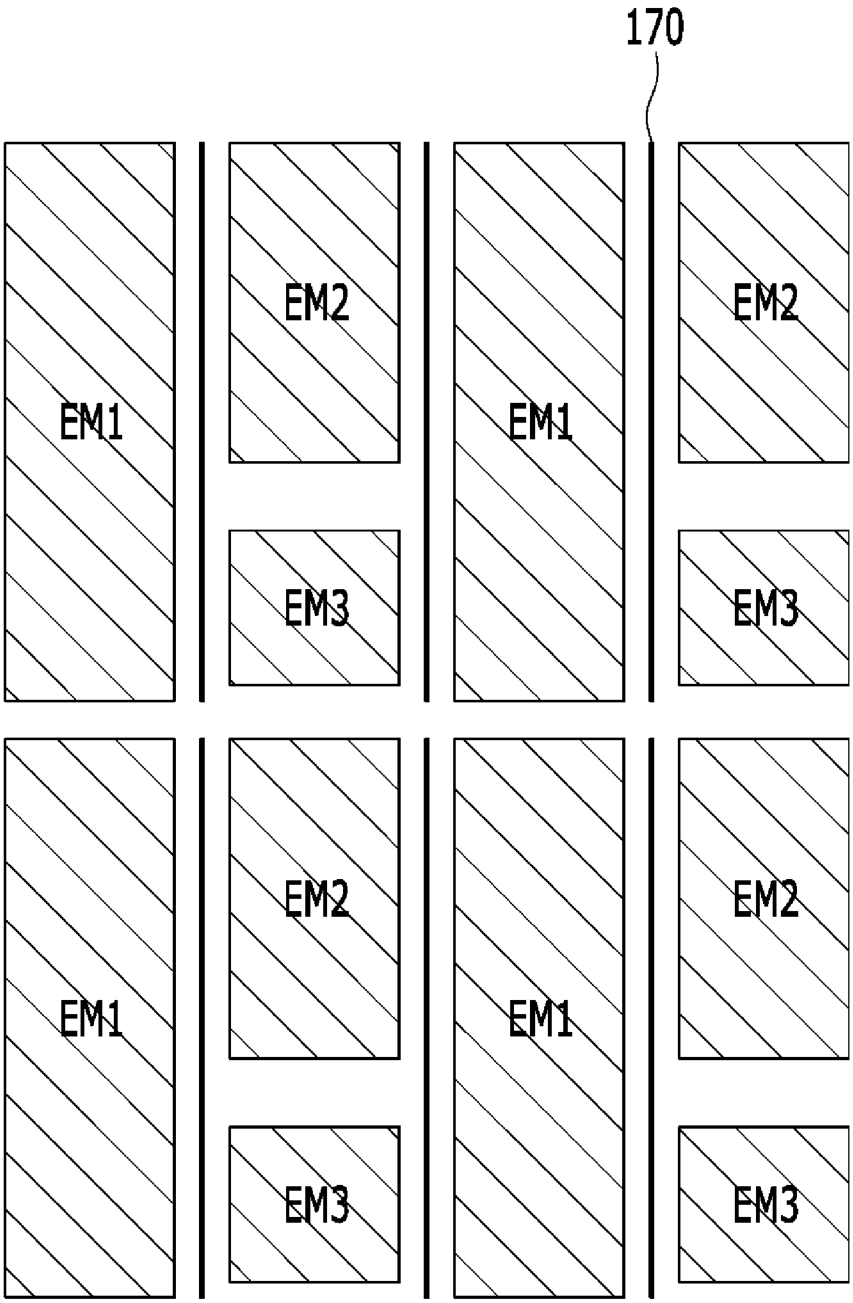
FIG. 4 is a plan view illustrating a light emitting display device according to a second embodiment of the present disclosure.

FIG. 4 is a plan view illustrating a light emitting display device according to a second embodiment of the present disclosure.

As shown in FIG. 4, the light emitting display device according to the second embodiment of the present disclosure has a configuration in which a first light emitting part EM1 which is long in a longitudinal direction, and a second light emitting part EM2 and a third light emitting part EM3 are disposed adjacent to each other. A length of the first light emitting part EM1 in the longitudinal direction is greater than the sum of a length of the second light emitting part EM2 in the longitudinal direction and a length of the third light emitting part EM3 in the longitudinal direction. The second light emitting part EM2 and the third light emitting part EM3 that are adjacent to each other in the longitudinal direction are arranged to be adjacent to a longitudinal side of approximately one first light emitting part EM1. In addition, an insulating pattern 170 is provided in parallel to the longitudinal side of the first light emitting part EM1.

For example, this configuration is effective in preventing or at least reducing the influence of lateral leakage current generated from the first light emitting part EM1. For example, in a case where a blue light emitting part has a threshold voltage relatively higher than those of light emitting parts having different colors, light leakage occurs in a case where the adjacent light emitting parts that are not turned on, having different colors, emit light when the blue light emitting part is turned on.

As shown in FIG. 4, in the light emitting display device according to the second embodiment of the present disclosure, in a case where the first light emitting part EM1 is set as a blue light emitting part, and any one of the second light emitting part EM2 and the third light emitting part EM3 is set as a green light emitting part and the other is set as a red light emitting part, it is possible to effectively prevent or at least reduce blue low gradation color leakage.

In particular, the light emitting display device of the present embodiment has an advantage of achieving stable operation for low gradation and low power driving by preventing or at least reducing low gradation color leakage.

The emission colors of the first to third light emitting parts (EM1, EM2, and EM3) are not limited to the above-described color arrangement, and may be changed as needed.

As in the above-described structure shown in FIG. 2, in the light emitting display device of the present disclosure, since the intermediate layer 180 is removed from above the insulating pattern 170, it is possible to prevent lateral leakage current flowing to adjacent light emitting parts through the common layer of the intermediate layer 180.

Figure 5:
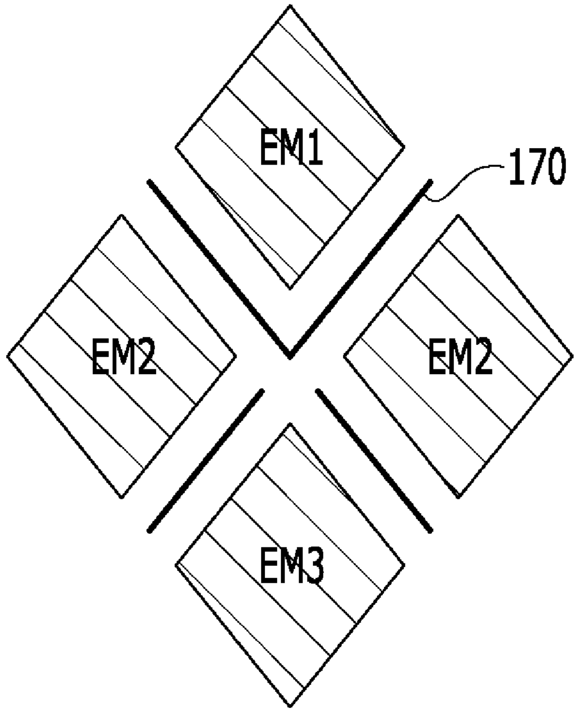
FIG. 5 is a plan view illustrating a light emitting display device according to a third embodiment of the present disclosure.

FIG. 5 is a plan view illustrating a light emitting display device according to a third embodiment of the present disclosure.

As shown in FIG. 5, the light emitting display device according to the third embodiment of the present disclosure has a configuration in which each of the light emitting parts (EM1, EM2, and EM3) has a diamond shape, the first and third light emitting parts EM1 and EM3 are disposed in the longitudinal direction, and the second light emitting parts EM2 are disposed in the transverse direction. Here, the insulating pattern 170 is provided to form opposite diagonal lines between the first light emitting part EM1 and the left and right second light emitting parts EM2, in which a bending point where the opposite diagonal lines meet faces the third light emitting part EM3. With this configuration, the diagonal lines of the insulating pattern 170 may divide the intermediate layer 180 between the first light emitting part EM1 and the second light emitting parts EM2, and the central bending point of the insulating pattern 170 may distinguish the first light emitting part EM1 from the third light emitting part EM3.

Accordingly, in the light emitting display device according to the third embodiment of the present disclosure, even in a case where the planar arrangement of the light emitting parts is different from that of the second embodiment, since the insulating pattern 170 is provided between the light emitting parts (EM1, EM2, and EM3) adjacent to each other, and the intermediate layer 180 on the insulating pattern 170 is removed, it is possible to effectively prevent lateral leakage current between adjacent sub-pixels or between adjacent light emitting parts.

Figure 6:
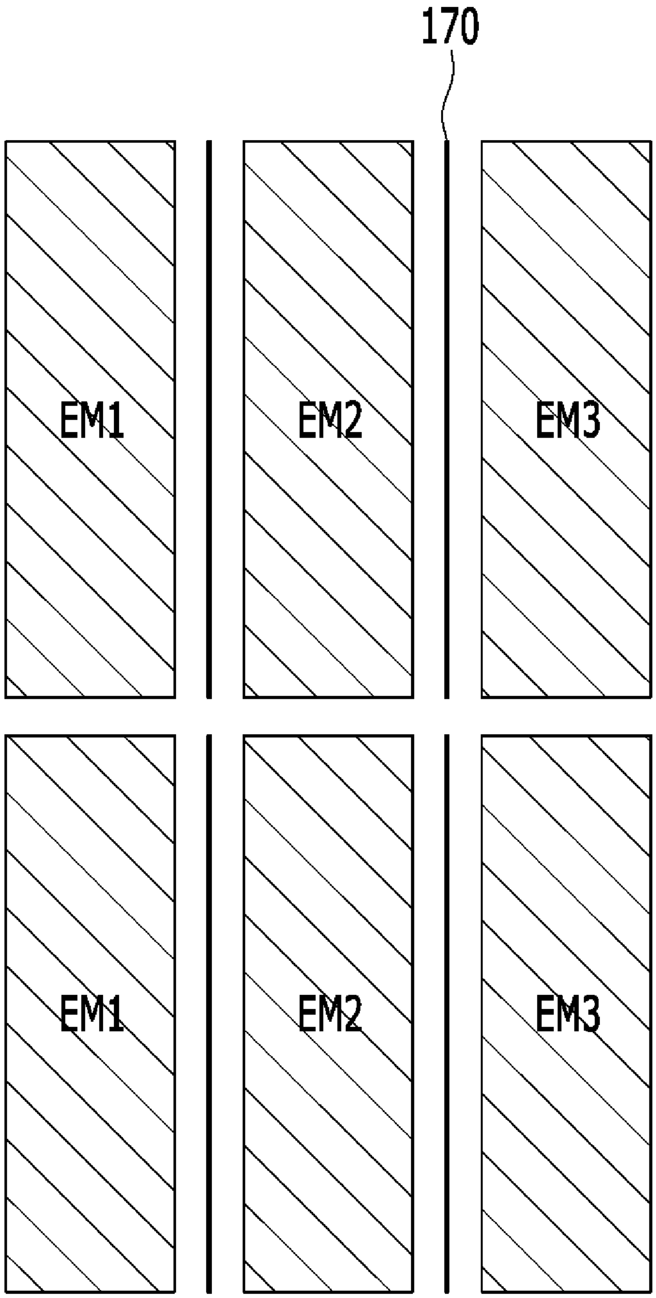
FIG. 6 is a plan view illustrating a light emitting display device according to a fourth embodiment of the present disclosure.

FIG. 6 is a plan view illustrating a light emitting display device according to a fourth embodiment of the present disclosure.

As shown in FIG. 6, the light emitting display device according to the fourth embodiment of the present disclosure has a configuration in which first to third light emitting parts (EM1, EM2, and EM3) are arranged side by side. Here, similarly, since the insulating pattern 170 is provided between the adjacent light emitting parts (EM1, EM2, and EM3), and the intermediate layer 180 on the insulating pattern 170 is removed, it is possible to prevent lateral leakage current between adjacent sub-pixels or between adjacent light emitting parts.

In the light emitting display device according to the fourth embodiment, since the insulating pattern 170 is disposed between all two adjacent light emitting parts, it is possible to prevent lateral leakage current regardless of emission colors between adjacent light emitting parts.

Further, each of the planar structures shown in FIGS. 4 to 6 may correspond to two adjacent light emitting parts and the insulating pattern therebetween in the cross-sectional structure of the light emitting display device according to the first embodiment of the present disclosure shown in FIG. 2, and may show the same effects as in the light emitting display device according to the first embodiment of the present disclosure.

Hereinafter, a method for manufacturing a light emitting display device according to the present disclosure will be described.

FIGS. 7A to 7F are cross-sectional views illustrating processes of a method for manufacturing a light emitting display device according to an embodiment of the present disclosure.

Figure 7A:
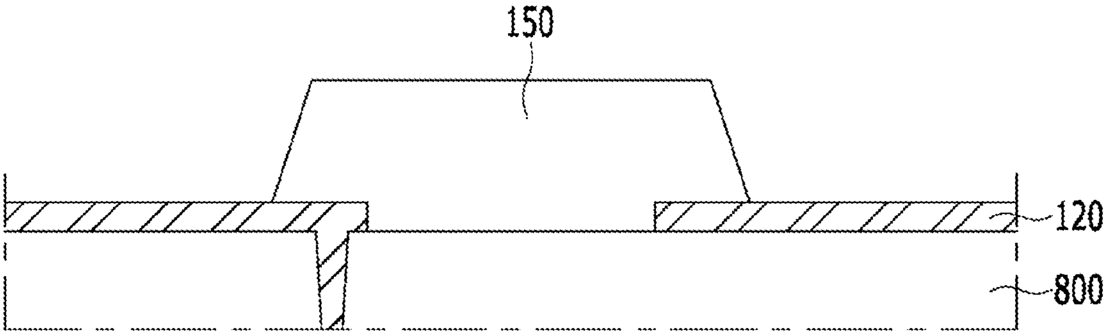
FIGS. 7A to 7F are cross-sectional views illustrating processes of a method for manufacturing a light emitting display device according to an embodiment of the present disclosure.

First, as shown in FIG. 7A, a plurality of anodes 120 spaced apart from each other is formed on a thin film transistor array substrate 800.

Then, a bank 150 is formed to expose light emitting parts of the plurality of anodes 120.

Figure 7B:
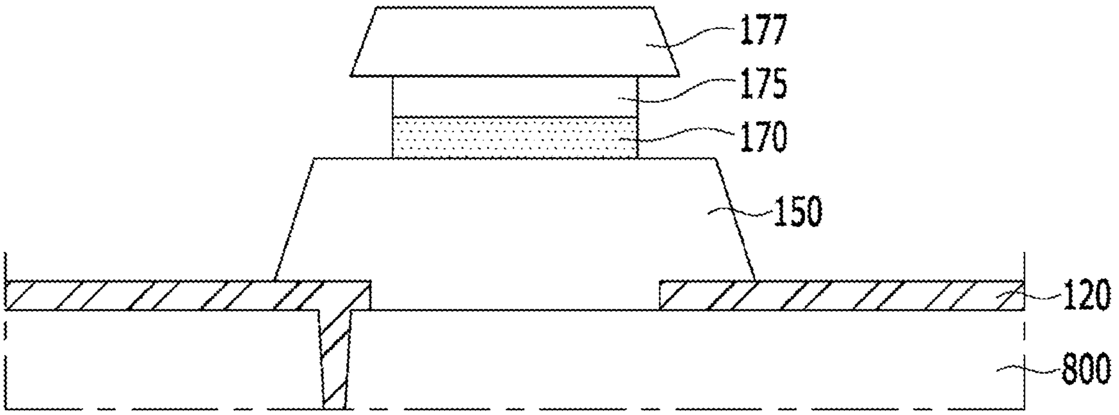

As shown in FIG. 7B, an insulating pattern 170, a sacrificial layer 175, and a photosensitive film 177 are sequentially formed on a part of the bank 150.

Here, the insulating pattern 170 is formed to have a greater thickness than the total thickness of the intermediate layer 180 and the second electrode 190 around the insulating pattern 170 to be formed later.

Further, the sacrificial layer 175 may be formed of an organic compound soluble in a fluorine solvent. The organic compound for the sacrificial layer 175 may include high fluorine single molecules, oligomers, or polymers. The sacrificial layer 175 may be formed of, for example, polytetrafluoroethylene (PTFE), polyvinylidene fluoride (PVDF), polyvinyl fluoride (PVF), tetrafluoroethylene (TFE), perfluoroalkoxy alkanes (PFA), ethylene tetrafluoroethylene (ETFE), chlorotrifluoroethylene (CTFE), perfluoropropylene vinyl ether (PPVE), poly-perfluoro (3-butenyl vinyl ether) (PBVE), perfluoro (2,2-dimethyl-1,3-dioxole) (PDD), ethoxyphenyl fluorine (EFP), or ethylene chlorotrifluoroethylene (ECTFE).

Here, the insulating pattern 170 and the sacrificial layer 175 are formed by performing etching using the photosensitive film 177 as a mask. The insulating pattern 170 and the sacrificial layer 175 have an etching ratio to an etchant higher than that of the photosensitive film 177, and thus, have a shape etched farther inward with reference to the width of a lower end of the photosensitive film 177 after the etching process. That is, after the formation of the insulating pattern 170 and the sacrificial layer 175, the photosensitive film 177 protrudes outward, so that the stacked insulating pattern 170, sacrificial layer 175, and photosensitive film 177 form an undercut structure.

Figure 7C:
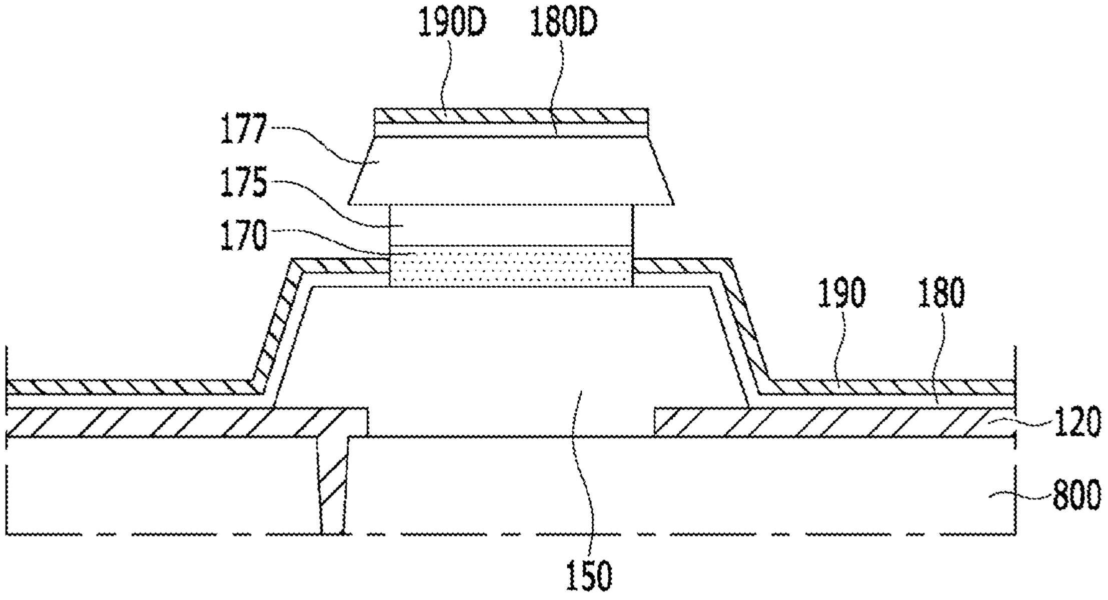

Then, as shown in FIG. 7C, the intermediate layer 180 and the second electrode 190 are sequentially formed on the upper surface of the photosensitive film 177, and the area exposed from the photosensitive film 177, that is, on the light emitting parts (EM1, EM2, . . . ) of the anodes 120 and the bank 150. In this process, since the photosensitive film 177 is located outside the sacrificial layer 175, the intermediate layer 180 is formed around the insulating pattern 170 on the lower side, and an intermediate layer dummy pattern 180D is formed on the upper surface of the photosensitive film 177 to be separated from the intermediate layer 180. Similarly, the second electrode 190 is formed on the intermediate layer 180, and a second electrode dummy pattern 190D is formed on the intermediate dummy pattern 180D to be separated from the second electrode 190. Here, the side surface of the separated intermediate layer 180 and the side surface of the second electrode 190 sequentially contact the side surface of the insulating pattern 170.

Figure 7D:
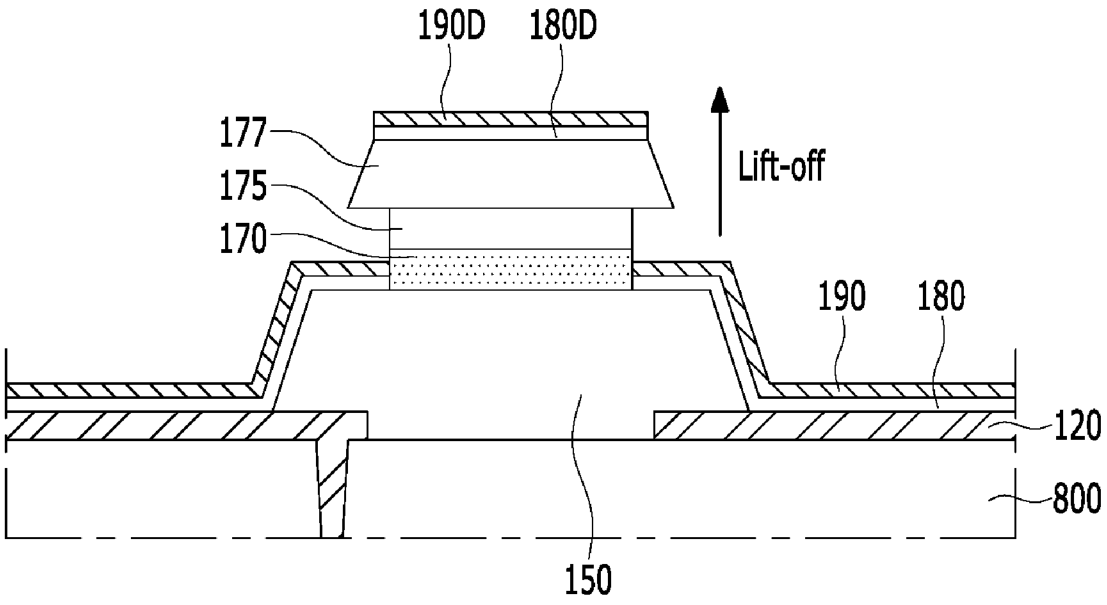
Figure 7E:
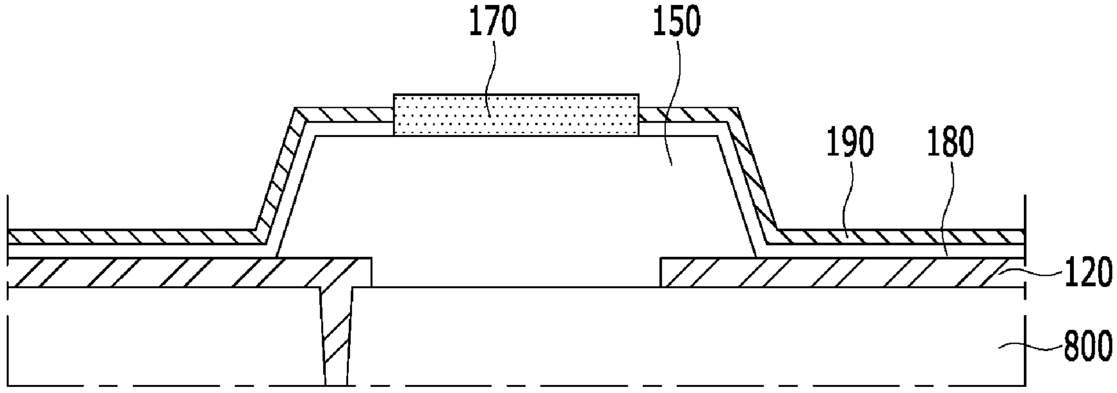

Then, as shown in FIG. 7D, the sacrificial layer 175 and the upper structure are lifted off and removed together. In the lift-off process, a fluorine solvent may be used. In this case, the sacrificial layer 175 is melted by the fluorine solvent and is removed together with the photosensitive film 177, and the intermediate layer dummy pattern 180D and the second electrode dummy pattern 190D above the photosensitive film 177 which form the upper structure, and thus, the upper surface of the insulating pattern 170 is exposed as shown in FIG. 7E.

Figure 7F:
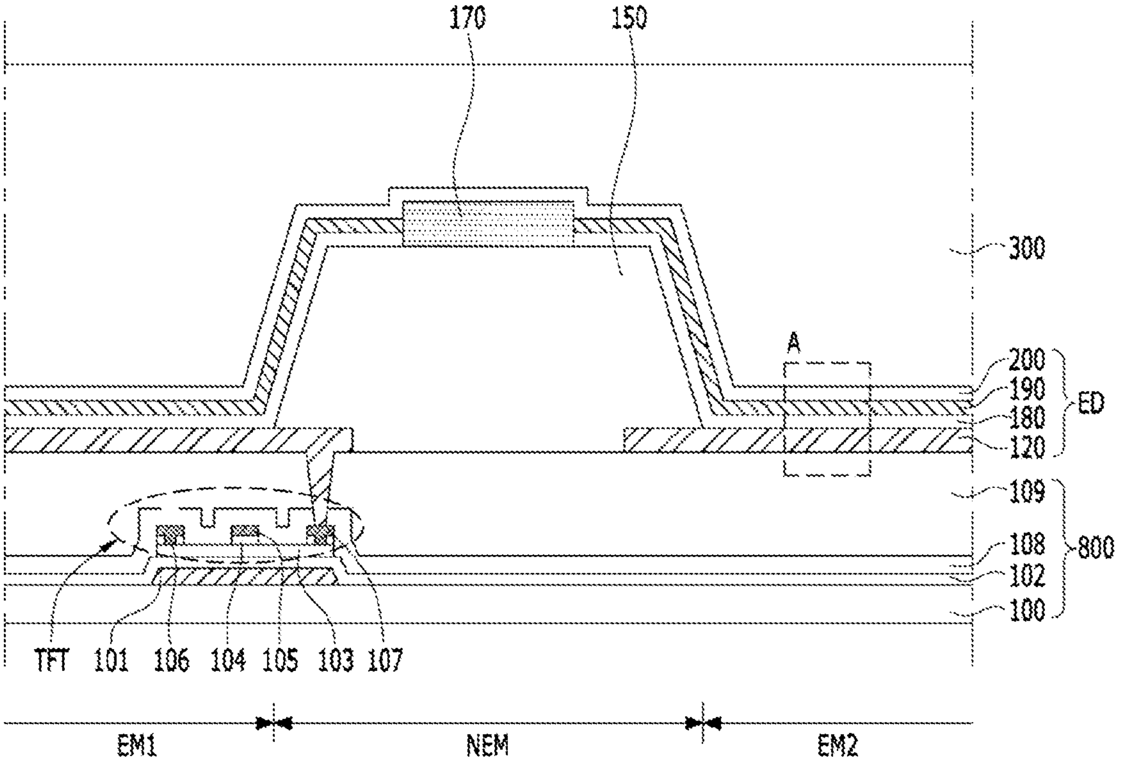

Then, as shown in FIG. 7F, the first electrode 200 is commonly formed on the insulating pattern 170 and the second electrode 190 is exposed around the insulating pattern 170. With this configuration, the stacked second electrode 190 and first electrode 200 function as a cathode CAT in an area excluding the insulating pattern 170.

After the cathode CAT is formed, an encapsulation layer 300 including a capping layer is formed to protect the lower components.

The method for manufacturing the light emitting display device of the present disclosure has the following effects.

By forming an insulating pattern on a bank, forming a structure on the insulating pattern, and then removing an intermediate layer formed on the structure together with the structure to provide an area where the intermediate layer is removed on the insulating pattern, it is possible to prevent lateral leakage current flowing in a case where the intermediate layer is interposed between adjacent sub-pixels.

Further, since an electrode is further formed on the insulating pattern where the intermediate layer is removed to function as a cathode, it is possible to secure a certain thickness of the cathode over the entire display area, thereby preventing voltage drop of the cathode.

In removing a structure of a second electrode and the intermediate layer on the insulating pattern, since a uniform first electrode is formed on the entire surface after the structure on the insulating pattern is removed, it is possible to prevent non-uniformity in luminance due to omission of the cathode in the display area.

Since the insulating pattern may be made of an inorganic insulating film or an organic film used in the field of display devices, it is possible to prevent occurrence of harmful substances during the process and lateral leakage current, thereby manufacturing a reliable light emitting display device. Accordingly, an ESG (Environment/Social/Governance) effect can be achieved in terms of eco-friendliness, low power consumption, and process optimization.

Figure 8:
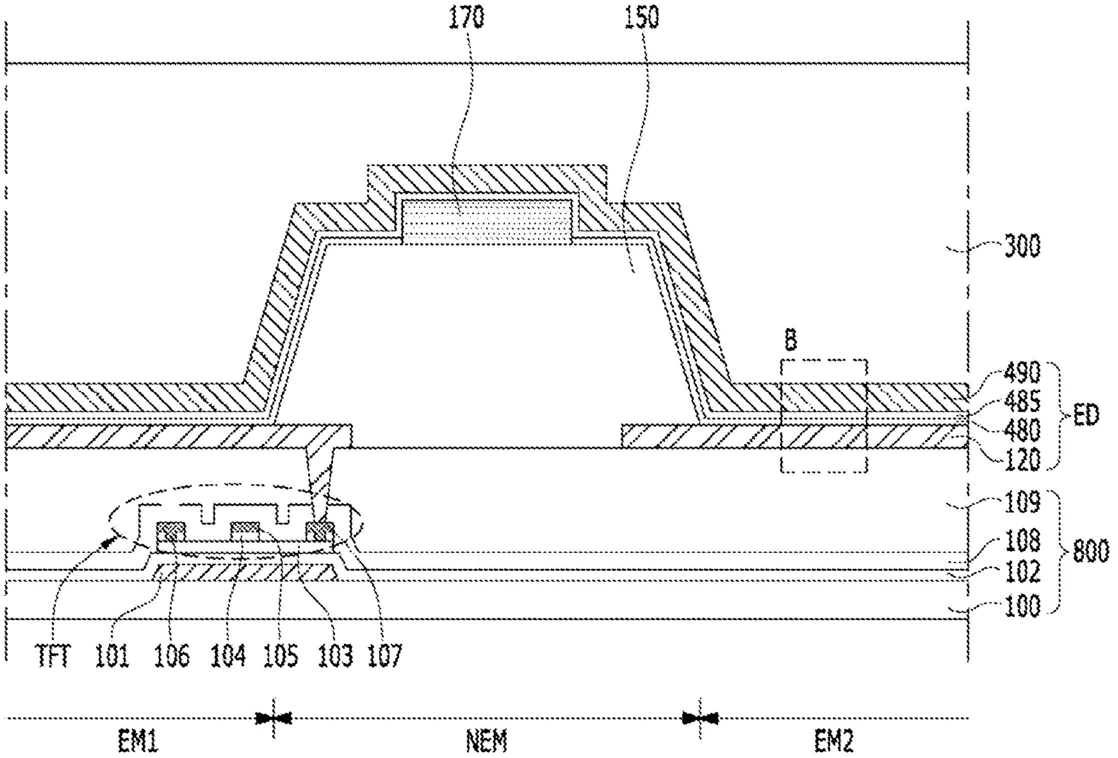
FIG. 8 is a cross-sectional view of a light emitting display device according to a fifth embodiment of the present disclosure.
Figure 9:
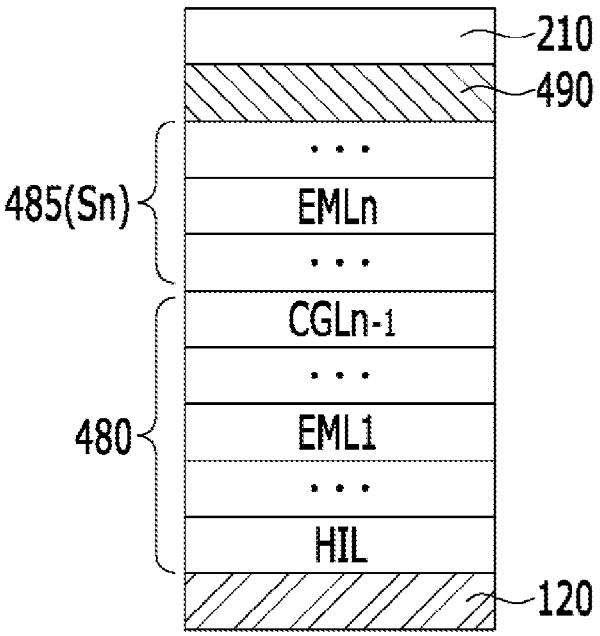
FIG. 9 is an enlarged cross-sectional view of area B in FIG. 8 according to an embodiment of the present disclosure.

FIG. 8 is a cross-sectional view of a light emitting display device according to a fifth embodiment of the present disclosure, and FIG. 9 is an enlarged cross-sectional view of area B in FIG. 8.

As shown in FIGS. 8 and 9, in the light emitting display device according to the fifth embodiment of the present disclosure, a first intermediate layer 480 is formed, a removal process of a structure on the insulating pattern 170 is performed, and then, a second intermediate layer 485 including additional stacks and a cathode 490 are formed.

In this case, the second intermediate layer 485 and the cathode 490 are also positioned on the insulating pattern 170, which is different from the structure in which the first intermediate layer 480 is separated between adjacent light emitting parts. Here, since the second intermediate layer 485 includes common layers having lower electron mobility than the first intermediate layer 480, there is little influence of lateral leakage current even in a case where the second intermediate layer 485 is continuously connected between adjacent light emitting parts EM1 and EM2.

Here, the first intermediate layer 480 includes a plurality of first to (n−1)th stacks and first to (n−1)th charge generating layers between the stacks. The second intermediate layer 485 includes the nth stack.

The minimum structure of the first intermediate layer 480 includes one stack and one charge generating layer.

The structure of the first intermediate layer 480 is not limited thereto, and the first intermediate layer 480 may include a plurality of stacks.

The stacks of the first intermediate layer 480 and the second intermediate layer 485 may include light emitting layers EML1 to EMLn, respectively, and may include a common layer below and above each of the light emitting layers EML1 to EMLn.

The uppermost layer of the first intermediate layer 480 is a charge generating layer (CGL). In the light emitting display device according to the fifth embodiment of the present disclosure, since light emitting parts adjacent to the charge generating layer (CGL) or adjacent sub-pixels are separated through the insulating pattern 170, it is possible to effectively prevent lateral leakage current.

In the light emitting display device according to the fifth embodiment of the present disclosure, as shown in FIG. 8, since the cathode 490 is formed after the first intermediate layer 480 on the insulating pattern 170 is removed, even in a case where the cathode 490 has a single layer, the cathode 490 is not disconnected due to other components, thereby making it possible to have uniform power level distribution without increasing resistance, in forming the cathode 490 with a predetermined thickness under cavity conditions according to the emission method.

Further, after the cathode 490 is formed, an encapsulation layer 300 including a capping layer 210 may be further provided above the cathode 490 to protect the light emitting device ED and improve light emission efficiency.

In the light emitting display device according to the fifth embodiment of the present disclosure, a common layer having high mobility may be provided as a configuration of the intermediate layer to be removed together with the structure on the insulating pattern, and an additional light emitting stack having low mobility may be formed in the horizontal direction after the structure is removed. In this case, since the common layer having high mobility may be divided for each sub-pixel, it is possible to prevent color leakage due to lateral leakage current between adjacent sub-pixels.

Figure 10:
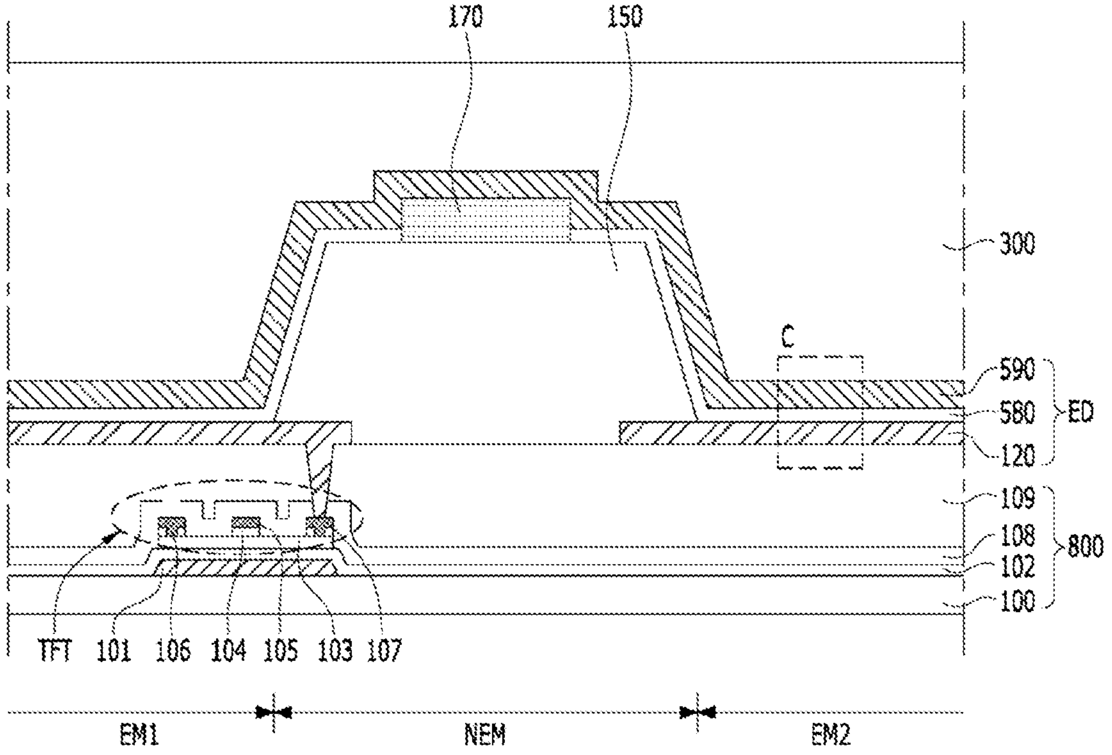
FIG. 10 is a cross-sectional view of a light emitting display device according to a sixth embodiment of the present disclosure.
Figure 11A:
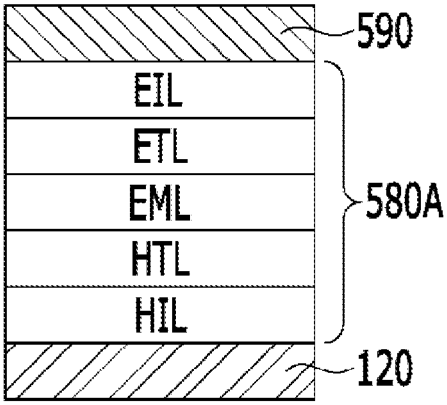
FIGS. 11A and 11B are enlarged cross-sectional views of area C in FIG. 10 according to one or more embodiments of the present disclosure.
Figure 11B:
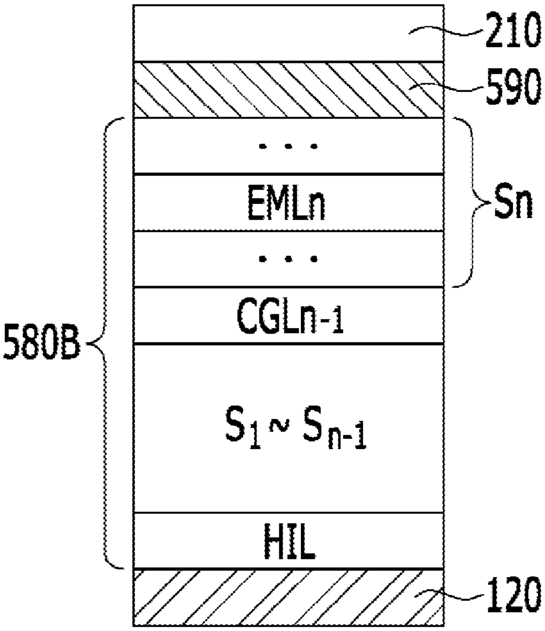

FIG. 10 is a cross-sectional view of a light emitting display device according to a sixth embodiment of the present disclosure, and FIGS. 11A and 11B are enlarged cross-sectional views of area C in FIG. 10.

As shown in FIGS. 10, 11A, and 11B, in the light emitting display device according to the sixth embodiment of the present disclosure, an intermediate layer 580 is removed from above the insulating pattern 170 immediately after the intermediate layer 580 is formed, and a cathode 590 is formed on the exposed insulating pattern 170 and the intermediate layer 580 around the insulating pattern 170.

In this case, the light emitting device ED includes the anode 120, the intermediate layer 580, and the cathode 590.

In the light emitting display device according to the sixth embodiment of the present disclosure, the intermediate layer 580 and the cathode 590 are different in position in whether there is an area located above the insulating pattern 170.

Further, in the light emitting display device according to the sixth embodiment of the present disclosure, as shown in FIG. 10, since the cathode 590 is formed after the intermediate layer 580 on the insulating pattern 170 is removed, even in a case where the cathode 590 has a single layer, the cathode 590 is not disconnected due to other components of the insulating pattern 170, thereby making it possible to have uniform power level distribution without increasing resistance, in forming the cathode 590 with a predetermined thickness under cavity conditions according to the emission method.

Further, after the cathode 590 is formed, an encapsulation layer 300 including a capping layer 210 may be further provided on the cathode 590 to protect the light emitting device ED and improve light emission efficiency, as shown in FIGS. 11A and 11B.

In the light emitting display device according to the sixth embodiment of the present disclosure, as shown in FIG. 11A, an intermediate layer 580A may have a single stack structure of a hole injection layer (HIL), a hole transport layer (HTL), an emission layer (EML), an electron transport layer (ETL), and an electron injection layer (EIL). Further, as shown in FIG. 11B, an intermediate layer 580B may have a structure including a plurality of stacks S1 to Sn and charge generating layers CGL1 to CGLn−1 between the stacks.

A light emitting display device according to an embodiment of the present disclosure may include a plurality of anodes provided on a substrate, a bank configured to expose light emitting parts of the plurality of anodes, an insulating pattern provided on a part of the bank, a first intermediate layer provided on another part of the bank different from the part where the insulating pattern is provided and the light emitting parts of the plurality of anodes, and a cathode configured to have a first area on the insulating pattern and a second area on the first intermediate layer.

A light emitting display device according to one or more aspects of the present disclosure may comprise a plurality of anodes on a substrate, a bank to expose light emitting parts of the plurality of anodes, an insulating pattern on a part of the bank, a first intermediate layer on a remaining port of bank excluding the part where the insulating pattern is provided and the light emitting parts of the plurality of anodes and a cathode comprising a first area on the insulating pattern and a second area on the first intermediate layer.

In a light emitting display device according to one or more aspects of the present disclosure, the second area may be thicker than the first area.

In a light emitting display device according to one or more aspects of the present disclosure, the insulating pattern may have a shape protruding in a vertical direction on an upper surface of the bank. Also a thickness of the insulating pattern may be greater than a thickness of the first intermediate layer.

In a light emitting display device according to one or more aspects of the present disclosure, the first area may comprise a single layer of a first electrode, and the second area may comprise the first electrode and a second electrode provided between the first electrode and the first intermediate layer, the thickness of the insulating pattern may be greater than the sum of the thickness of the first intermediate layer and a thickness of the second electrode.

In a light emitting display device according to one or more aspects of the present disclosure, the insulating pattern may be any one of an oxide film, a nitride film, and an organic material film including a fluorine content of 20% or less.

In a light emitting display device according to one or more aspects of the present disclosure, in the second area of the cathode may be in contact with the first intermediate layer, and the first area of the cathode may be in contact with the insulating pattern.

In a light emitting display device according to one or more aspects of the present disclosure, the first area may comprise a single layer of a first electrode, and the second area may comprise the first electrode and a second electrode that is provided between the first electrode and the first intermediate layer.

In a light emitting display device according to one or more aspects of the present disclosure, a side surface of the first intermediate layer and a side surface of the second electrode may be in contact with a side surface of the insulating pattern.

In a light emitting display device according to one or more aspects of the present disclosure, the first intermediate layer may comprise one or more light emitting stacks. And an uppermost layer of the first intermediate layer in contact with the cathode may be an electron injection layer. Or an uppermost layer of the first intermediate layer may be a charge generating layer.

A light emitting display device according to one or more aspects of the present disclosure may further comprise a second intermediate layer that is in contact with the charge generating layer and covers surfaces of the first intermediate layer and the insulating pattern. The second intermediate layer may comprise an additional light emitting stack.

In a light emitting display device according to one or more aspects of the present disclosure, a lower surface of the cathode may be in contact with an upper surface of the second intermediate layer.

In a light emitting display device according to one or more aspects of the present disclosure, an electron mobility of the second intermediate layer may be lower than an electron mobility of the first intermediate layer.

In a light emitting display device according to one or more aspects of the present disclosure, the thickness of the cathode in the first area and the thickness of the cathode in the second area may be the same.

A light emitting display device according to one or more aspects of the present disclosure may further comprise a capping layer on the first area and the second area.

A light emitting display device according to one or more aspects of the present disclosure may further comprise an encapsulation layer on the capping layer.

In a light emitting display device according to one or more aspects of the present disclosure, the light emitting parts of the plurality of anodes may comprise a first light emitting part, a second light emitting part, and a third light emitting part disposed adjacent to each other, the second light emitting part and the third light emitting part may be adjacent to each other in a longitudinal direction and arranged to be adjacent to a longitudinal side of one first light emitting part, the insulating pattern may be provided in parallel to the longitudinal side of the first light emitting part.

In a light emitting display device according to one or more aspects of the present disclosure, the light emitting parts of the plurality of anodes may comprise a first light emitting part, a second light emitting part, and a third light emitting part disposed adjacent to each other, each of the first light emitting part, the second light emitting part, and the third light emitting part may have a diamond shape, the first light emitting part and the third light emitting part may be disposed in a longitudinal direction, and two adjacent second light emitting parts may be disposed in a transverse direction perpendicular to the longitudinal direction, the insulating pattern may be provided to form opposite diagonal lines between the first light emitting part and the two adjacent second light emitting parts, in which a bending point where the opposite diagonal lines meet faces the third light emitting part.

A method for manufacturing a light emitting display device according to one or more aspects of the present disclosure may comprise a first step of providing a plurality of anodes on a substrate, a second step of providing a bank to expose light emitting parts of the plurality of anodes, a third step of sequentially providing an insulating pattern, a sacrificial layer, and a photosensitive film on a part of the bank, a fourth step of providing an intermediate layer on the photosensitive film, and the light emitting parts of the anodes and the bank exposed from the photosensitive film, a fifth step of providing a first electrode on the intermediate layer, a sixth step of removing the sacrificial layer, the photosensitive film, and a structure on the photosensitive film and a seventh step of providing a second electrode on the insulating pattern and the first electrode to form a cathode comprising the first electrode and the second electrode.

In a method for manufacturing a light emitting display device according to one or more aspects of the present disclosure, in the seventh step, the first electrode may be connected to the second electrode outside the insulating pattern.

In a method for manufacturing a light emitting display device according to one or more aspects of the present disclosure, the sacrificial layer may comprise an organic compound containing 20% or more of fluorine atoms.

In a method for manufacturing a light emitting display device according to one or more aspects of the present disclosure, the intermediate layer may comprise a plurality of light emitting stacks and a charge generating layer between the plurality of light emitting stacks. After the sixth step, the intermediate layer may be removed from above the insulating pattern and be separated by the insulating pattern as a boundary.

In a method for manufacturing a light emitting display device according to one or more aspects of the present disclosure, the thickness of the insulating pattern may be greater than the thickness of the intermediate layer.

A method for manufacturing a light emitting display device according to one or more aspects of the present disclosure comprise a first step of forming a plurality of anodes on a substrate, a second step of forming a bank to expose light emitting parts of the plurality of anodes, a third step of sequentially forming an insulating pattern, a sacrificial layer, and a photosensitive film on a part of the bank, a fourth step of forming a first intermediate layer on the photosensitive film, the light emitting parts of the anodes exposed from the photosensitive film, and the bank, a fifth step of removing the sacrificial layer, the photosensitive film, and a structure on the photosensitive film and a sixth step of forming a cathode on the first intermediate layer and the insulating pattern.

In a method for manufacturing a light emitting display device according to one or more aspects of the present disclosure, in the sixth step, the cathode may comprise a first area in contact with the first intermediate layer and a second area in contact with the insulating pattern.

A method for manufacturing a light emitting display device according to one or more aspects of the present disclosure may further comprise forming a second intermediate layer on the first intermediate layer and the insulating pattern, between the fifth step and the sixth step.

In a method for manufacturing a light emitting display device according to one or more aspects of the present disclosure, the sacrificial layer may be formed of an organic compound soluble in a fluorine solvent, and the insulating pattern may be formed of a material insoluble in a fluorine solvent, and in the fifth step a fluorine solvent may be used to solve the sacrificial layer.

In a method for manufacturing a light emitting display device according to one or more aspects of the present disclosure, an electron mobility of the second intermediate layer may be lower than an electron mobility of the first intermediate layer.

The light emitting display device of the present disclosure and the method for manufacturing the same have the following effects.

First, since an insulating pattern is formed on a bank, a structure is formed on the insulating pattern, and then, an intermediate layer formed on the structure is removed together with the structure to provide an area where the intermediate layer is removed on the insulating pattern, it is possible to prevent lateral leakage current flowing between adjacent sub-pixels in a case where the intermediate layer is interposed therebetween.

Second, since an electrode is further formed on the insulating pattern where the intermediate layer is removed to function as a cathode and to secure a certain thickness of the cathode over the entire display area, it is possible to prevent voltage drop of the cathode.

Third, in removing the electrode forming the cathode together with the intermediate layer on the insulating pattern, since a uniform cathode electrode is again formed on the entire surface after the structure on the insulating pattern is removed, it is possible to prevent non-uniformity in luminance due to omission of the cathode in the display area.

Fourth, a common layer with high mobility may be included in the intermediate layer removed together with the structure on the insulating pattern, and an additional stack with low mobility may be provided in the horizontal direction after the structure is removed. In this case, since the common layer having high mobility may be divided for each sub-pixel, it is possible to prevent color leakage due to lateral leakage current between adjacent sub-pixels.

Fifth, an inorganic insulating film or an organic film may be used in the field of the display devices, so that harmful substances are not generated during the process and lateral leakage current is prevented, thereby making it possible to manufacture a reliable light emitting display device. Accordingly, an ESG (Environmental/Social/Governance) effect can be achieved in terms of eco-friendliness, low power consumption, and process optimization.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A light emitting display device comprising:
a plurality of anodes on a substrate;
a bank configured to expose light emitting parts of the plurality of anodes;
an insulating pattern on a part of the bank;
a first intermediate layer on another part of the bank different from the part where the insulating pattern is provided and the light emitting parts of the plurality of anodes; and
a cathode comprising a first area on the insulating pattern and a second area on the first intermediate layer.

2. The light emitting display device according to claim 1, wherein the second area is thicker than the first area.

3. The light emitting display device according to claim 1, wherein the insulating pattern has a shape protruding in a vertical direction from an upper surface of the bank, and
a thickness of the insulating pattern is greater than a thickness of the first intermediate layer.

4. The light emitting display device according to claim 3, wherein the first area comprises a single layer of a first electrode, and the second area comprises the first electrode and a second electrode provided between the first electrode and the first intermediate layer; and
the thickness of the insulating pattern is greater than a sum of the thickness of the first intermediate layer and a thickness of the second electrode.

5. The light emitting display device according to claim 1, wherein the insulating pattern is any one of an oxide film, a nitride film, or an organic material film including a fluorine content of 20% or less.

6. The light emitting display device according to claim 1, wherein the second area of the cathode is in contact with the first intermediate layer, and the first area of the cathode is in contact with the insulating pattern.

7. The light emitting display device according to claim 1, wherein the first area comprises a single layer of a first electrode,
the second area comprises the first electrode and a second electrode, and
the second electrode is between the first electrode and the first intermediate layer.

8. The light emitting display device according to claim 7, wherein a side surface of the first intermediate layer and a side surface of the second electrode are in contact with a side surface of the insulating pattern.

9. The light emitting display device according to claim 1, wherein the first intermediate layer comprises one or more light emitting stacks, and
an uppermost layer of the first intermediate layer that is in contact with the cathode is an electron injection layer.

10. The light emitting display device according to claim 1,
wherein the first intermediate layer comprises one or more light emitting stacks, and
an uppermost layer of the first intermediate layer is a charge generating layer.

11. The light emitting display device according to claim 10, further comprising:
a second intermediate layer, wherein the second intermediate layer is in contact with the charge generating layer and covers surfaces of the first intermediate layer and the insulating pattern,
wherein the second intermediate layer comprises an additional light emitting stack.

12. The light emitting display device according to claim 11,
wherein a lower surface of the cathode is in contact with an upper surface of the second intermediate layer.

13. The light emitting display device according to claim 1,
wherein a thickness of the cathode in the first area and a thickness of the cathode in the second area are same.

14. The light emitting display device according to claim 1, further comprising:
a capping layer on the first area and the second area.

15. The light emitting display device according to claim 14, further comprising:
an encapsulation layer on the capping layer.

16. The light emitting display device according to claim 1,
wherein the light emitting parts of the plurality of anodes comprises a first light emitting part, a second light emitting part, and a third light emitting part disposed adjacent to each other, the second light emitting part and the third light emitting part are adjacent to each other in a longitudinal direction and are arranged to be adjacent to a longitudinal side of one first light emitting part, the insulating pattern is provided in parallel to the longitudinal side of the first light emitting part.

17. The light emitting display device according to claim 1, wherein the light emitting parts of the plurality of anodes comprises a first light emitting part, a second light emitting part, and a third light emitting part disposed adjacent to each other, each of the first light emitting part, the second light emitting part, and the third light emitting part has a diamond shape, the first light emitting part and the third light emitting part are disposed in a longitudinal direction, and two adjacent second light emitting parts are disposed in a transverse direction perpendicular to the longitudinal direction, the insulating pattern is provided to form opposite diagonal lines between the first light emitting part and the two adjacent second light emitting parts, in which a bending point where the opposite diagonal lines meet faces the third light emitting part.

* * * * *